United States Patent [19]
Arena et al.

[11] Patent Number: 5,972,790
[45] Date of Patent: *Oct. 26, 1999

[54] METHOD FOR FORMING SALICIDES

[75] Inventors: Chantal Arena, Le Fontanil, France; Robert F. Foster, Phoenix, Ariz.; Joseph T. Hillman, Scottsdale, Ariz.; Michael S. Ameen, Phoenix, Ariz.; Jacques Faguet, Toulouse, France

[73] Assignee: Tokyo Electron Limited, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/489,040

[22] Filed: Jun. 9, 1995

[51] Int. Cl.⁶ .................................................. H01L 21/4763
[52] U.S. Cl. .......................... 438/649; 438/651; 438/655; 438/683; 438/685; 438/686
[58] Field of Search ...................................... 437/192, 193, 437/200; 438/677, 680, 683, 648, 649, 651, 655, 682, 685, 686; 427/576, 585, 595; 257/763, 764, 765

[56] References Cited

U.S. PATENT DOCUMENTS

| | | | |
|---|---|---|---|
| 4,151,325 | 4/1979 | Welch | 428/432 |
| 4,410,758 | 10/1983 | Grolitzer | 136/254 |
| 4,504,518 | 3/1985 | Ovshinsky et al. | 427/38 |
| 4,557,943 | 12/1985 | Rosler et al. | 427/38 |
| 4,635,347 | 1/1987 | Lien et al. | 29/591 |
| 4,678,679 | 7/1987 | Ovshinsky | 427/38 |
| 4,701,349 | 10/1987 | Koyanagi et al. | 427/228 |
| 4,774,195 | 9/1988 | Beneking | 437/16 |
| 4,876,983 | 10/1989 | Fukuda et al. | 118/722 |
| 4,886,683 | 12/1989 | Hoke et al. | 427/232 |
| 4,897,709 | 1/1990 | Yokoyama et al. | 359/68 |
| 4,900,694 | 2/1990 | Nakagawa | 437/109 |
| 4,913,929 | 4/1990 | Moslehi et al. | 427/39 |
| 4,927,786 | 5/1990 | Nishida | 437/233 |
| 4,987,102 | 1/1991 | Nguyen et al. | 437/238 |
| 5,010,842 | 4/1991 | Oda et al. | 118/723 |
| 5,052,339 | 10/1991 | Vakerlis et al. | 118/723 |
| 5,061,511 | 10/1991 | Saitoh et al. | 427/38 |
| 5,073,232 | 12/1991 | Ohmi et al. | 156/646 |
| 5,084,412 | 1/1992 | Nakasaki | 437/169 |
| 5,085,885 | 2/1992 | Foley et al. | 477/38 |
| 5,139,825 | 8/1992 | Gordon et al. | 427/255.2 |
| 5,141,613 | 8/1992 | Adoncecchi et al. | 204/192.1 |
| 5,173,327 | 12/1992 | Sandhu et al. | 427/573 |
| 5,175,017 | 12/1992 | Kobayashi et al. | 427/8 |
| 5,246,881 | 9/1993 | Sandhu et al. | 437/192 |
| 5,344,792 | 9/1994 | Sandhu et al. | 437/200 |
| 5,416,045 | 5/1995 | Kauffman et al. | 437/174 |
| 5,716,870 | 2/1998 | Foster et al. | 437/192 |
| 5,804,878 | 4/1996 | Miyazaki et al. | 257/764 |

FOREIGN PATENT DOCUMENTS

| | | | |
|---|---|---|---|
| 62-161951 | 8/1986 | Japan | C23C 14/06 |
| 2192196 | 1/1988 | United Kingdom | C23C 16/50 |
| 9004044 | 4/1990 | WIPO | C23C 8/36 |

OTHER PUBLICATIONS

Composition, Morphology and Mechanical Properties of Plasma–Assisted Chemically Vapor–Deposited TiN Films on M2 Tool Steel, M. R. Hilton et al., Metallurgical and Protective Coatings, Thin Solid Films, 139 (1986) 247–260.

(List continued on next page.)

*Primary Examiner*—Chandra Chaudhari
*Assistant Examiner*—Renee R. Bemy
*Attorney, Agent, or Firm*—Wood, Herron & Evans, LLP

[57] ABSTRACT

Titanium is deposited onto a semiconductor interconnect to form a salicide structure by plasma-enhanced chemical vapor deposition. The reactant gases, including titanium tetrachloride, hydrogen and optionally argon, are combined. A plasma is created using RF energy and the plasma contacts the rotating semiconductor material. This causes titanium to be deposited which reacts with exposed silicon to form titanium silicide without any subsequent anneal. Other titanium deposited on the surface, as well as titanium-rich silicon compositions ($TiSi_x$ wherein X is <2), are removed by chemical etching. If only about 40 Å of titanium is deposited, it will selectively deposit onto the silicon structure without coating the oxide spacers of the interconnect. In this embodiment the need to chemically etch the substrate is eliminated.

9 Claims, 3 Drawing Sheets

OTHER PUBLICATIONS

Silicon Processing for the VLSI Era; vol. 1: Process Technology, Stanley Wolf, Ph.D. and Richard N. Tauber Ph.D., Lattice Press, Sunset Beach, CA, 1986, pp. 559–564.

Formation of TiN on Si and $SiO_2$ by rapid processing using a large area electron beam, Die–chi Sun, et al., 8257B Journal of Vacuum Science & Technology B 5, Sep./Oct. 1987, Woodbury, NY, USA, pp. 1504–1507.

Composition, Morphology and Mechanical Properties of Plasma–Assisted Chemically Vapor–Deposited TiN Films on M2 Tool Steel, M. R. Hilton et al., 2194 Thin Solid Films, 139 (1986) Jun. 2nd, No. 3, Lausanne, Switzerland, pp. 247–260.

Spectroscopic investigations into plasma used for nitriding processes of steel and titanium, B. Kulakowska–Pawlak et al., 2194 Thin Solid Films, 230 (1993) Aug. 10, No. 2, Lausanne, Switzerland, pp. 115–120.

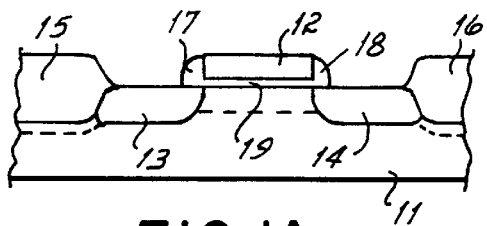
FIG. IA
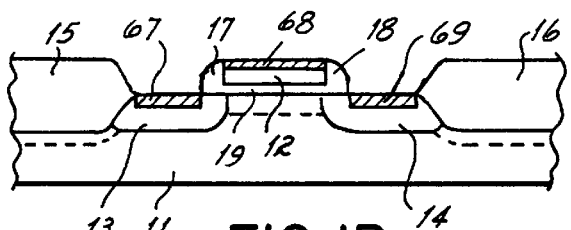
FIG. IB
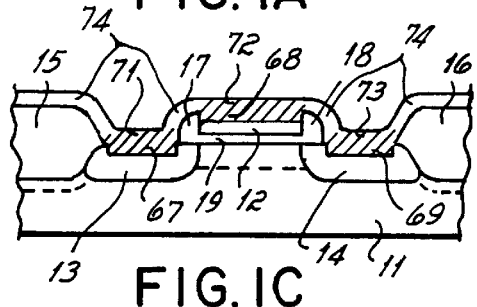
FIG. IC
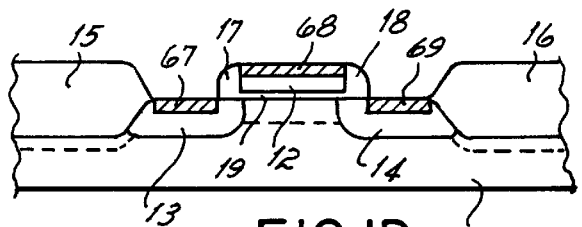
FIG. ID
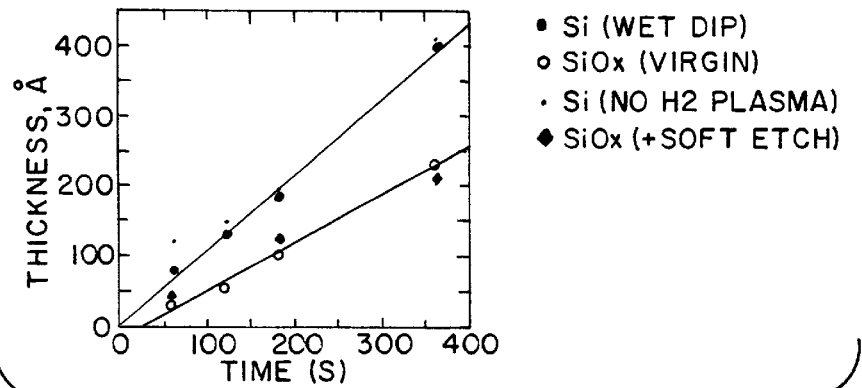
FIG. 3
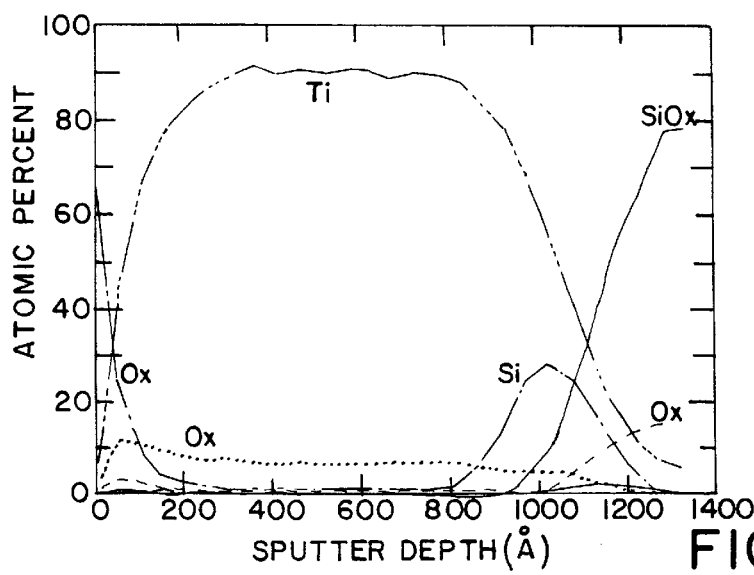
FIG. 4

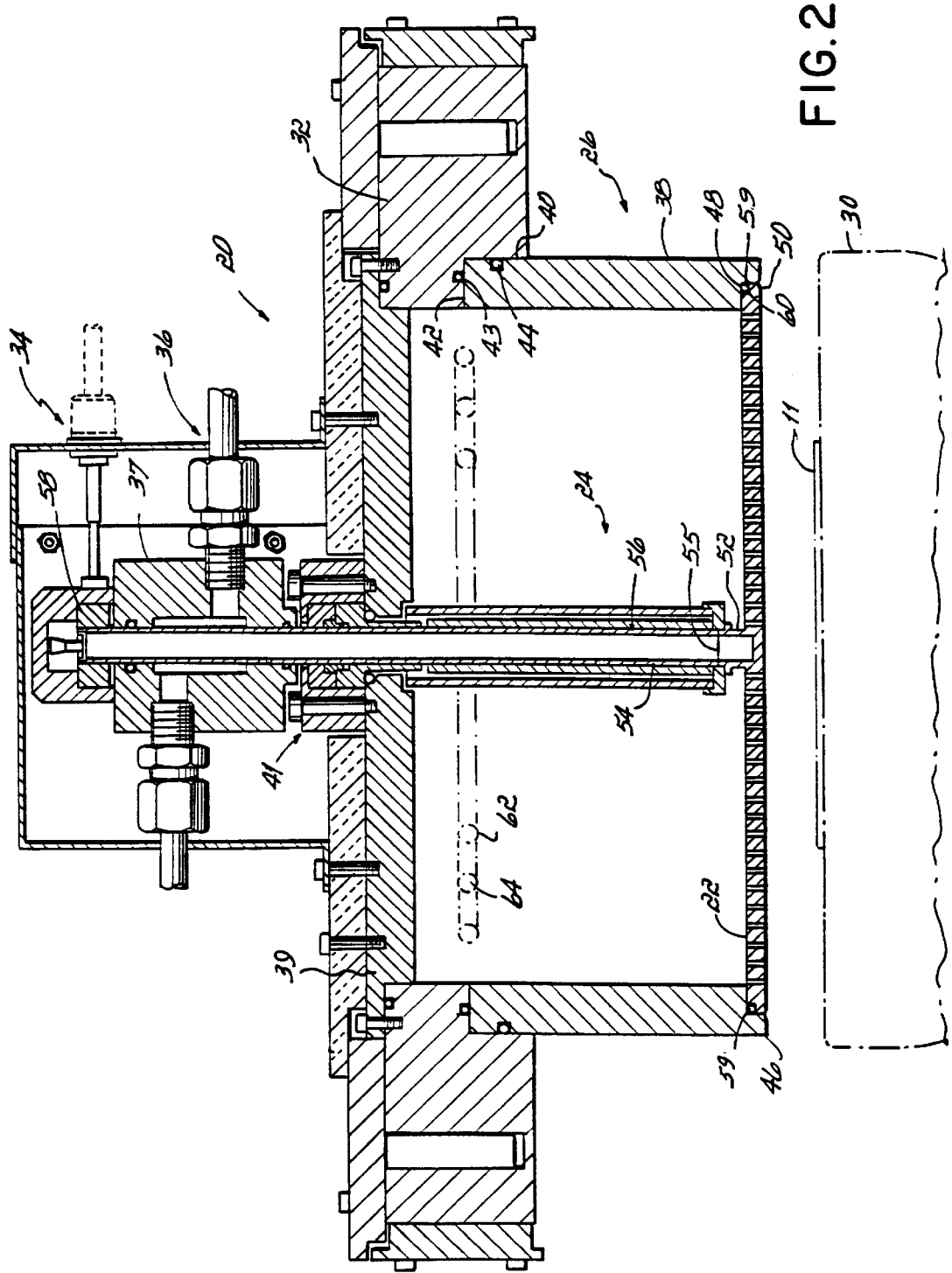

METHOD FOR FORMING SALICIDES

BACKGROUND OF THE INVENTION

Self-aligned silicides, commonly referred to as salicides, are formed when metal is deposited over an MOS structure and reacted with exposed silicon areas such as the source and drain, as well as exposed polysilicon areas on the gate, to form silicides. Oxide structures along the gate, known as oxide spacers, prevent the gate and source/drain areas from being electrically connected by avoiding silicide formation on the oxide. Following the silicide formation, a selective etch is used to remove unreacted metal without attacking the silicide.

The most widely used silicide for the salicide process is $TiSi_2$, although platinum and molybdenum silicides are also employed. Titanium silicide is attractive for this application because it exhibits the lowest resistivity of the refractory metal silicides. Since it can reduce native oxide layers, it is the most widely accepted refractory metal for reliably forming a silicide on both poly- and single-crystalline silicon by thermal reaction.

In the salicide structure, the silicide is formed in the diffusion areas and on the polysilicon gate. The oxide spacers separate these two regions by only about 2,000–3,000 Å. Thus, any lateral formation of silicide can easily bridge this separation and cause the gate to become shorted to the source/drain. It has been observed that if titanium silicide is formed by conventional furnace annealing in an inert gas atmosphere, such lateral titanium silicide formation rapidly occurs. By annealing in an ambient of nitrogen, the titanium absorbs a significant amount of nitrogen and, at the same time, reacts with the nitrogen and forms a nitride phase on the titanium surface. Once the titanium is fully reacted with the nitrogen, lateral silicide reaction is essentially suppressed.

Unfortunately, during the annealing process silicon can diffuse from the source, drain and gate regions and into the titanium which covers the oxide region. Thus, titanium silicide can be formed over the isolation oxide and sidewall spacers, as well as over the source, drain and gate regions. This silicide is not etched away by the selective etch. Therefore, when the second high-temperature anneal is performed, the silicide is converted to the low resistivity C54 phase. If this low resistivity silicide provides a continuous electrical path between the source, drain and gate regions, then the device will fail.

These problems can be reduced by controlling the rate of nitridation of the titanium. The titanium must be nitrided quickly enough to suppress the silicide formation over the oxide, yet slowly enough to permit sufficient silicide to form in the source, drain and gate regions. This is a very delicate process. The process can be better controlled by limiting the thickness of the sputtered titanium. This allows the titanium over the oxide to be quickly nitrided. Once it is nitrided, it cannot be silicided. However, if the sputtered titanium is too thin, then the thickness of the silicide formed over the source, drain and gate regions will be insufficient to provide low resistance.

SUMMARY OF THE INVENTION

It is an object of the present invention to provide a method for salicide formation which overcomes the problem of formation of titanium silicide over the isolation oxide and sidewall spacers. Further, it is an object of the present invention to simplify salicide formation by eliminating the need for nitridation of the titanium film.

These objects and advantages of the present invention can be achieved by depositing titanium over a partially-formed integrated circuit interconnect using plasma-enhanced chemical vapor deposition of titanium. According to the method of the present invention, titanium is deposited by plasma-enhanced chemical vapor deposition over the silicon electrodes. During this deposition titanium silicide is formed on the silicon electrodes, eliminating any need for heat treatment to form the silicide. Titanium is formed over silicon oxide spacers and isolation oxide. This titanium can be removed along with other deposited titanium through a chemical etch. A very thin titanium silicide layer is formed at the titanium/oxide interface. This layer tends to be a substoichiometric or titanium-rich silicide which is easily etched away with an acid etch. The stoichiometric titanium silicide formed over the silicon is not etched.

The initial deposition of titanium onto the semiconductor or interconnect only deposits onto the silicon electrode. Only after about 30 seconds of deposition does the titanium begin to deposit onto the oxide surface spacers and other portions of the substrate. Thus, where a relatively thin layer of titanium silicide is required, this can be deposited only onto the silicon, eliminating the need for subsequent etching. The objects and advantages of the present invention will be further appreciated in light of the following detailed description in which:

BRIEF DESCRIPTION OF THE DRAWINGS

FIGS. 1A–1D are a series of cross-sectional views depicting formation of a salicide according to the present invention.

FIG. 2 is a cross-sectional, diagrammatic view of a reactor for use in the present invention.

FIG. 3 is a graph depicting titanium deposition over silicon and silicon oxide surfaces, relative to time.

FIG. 4 is the AES depth profile of Ti deposited on $SiO_2$.

DETAILED DESCRIPTION

Figure 5:
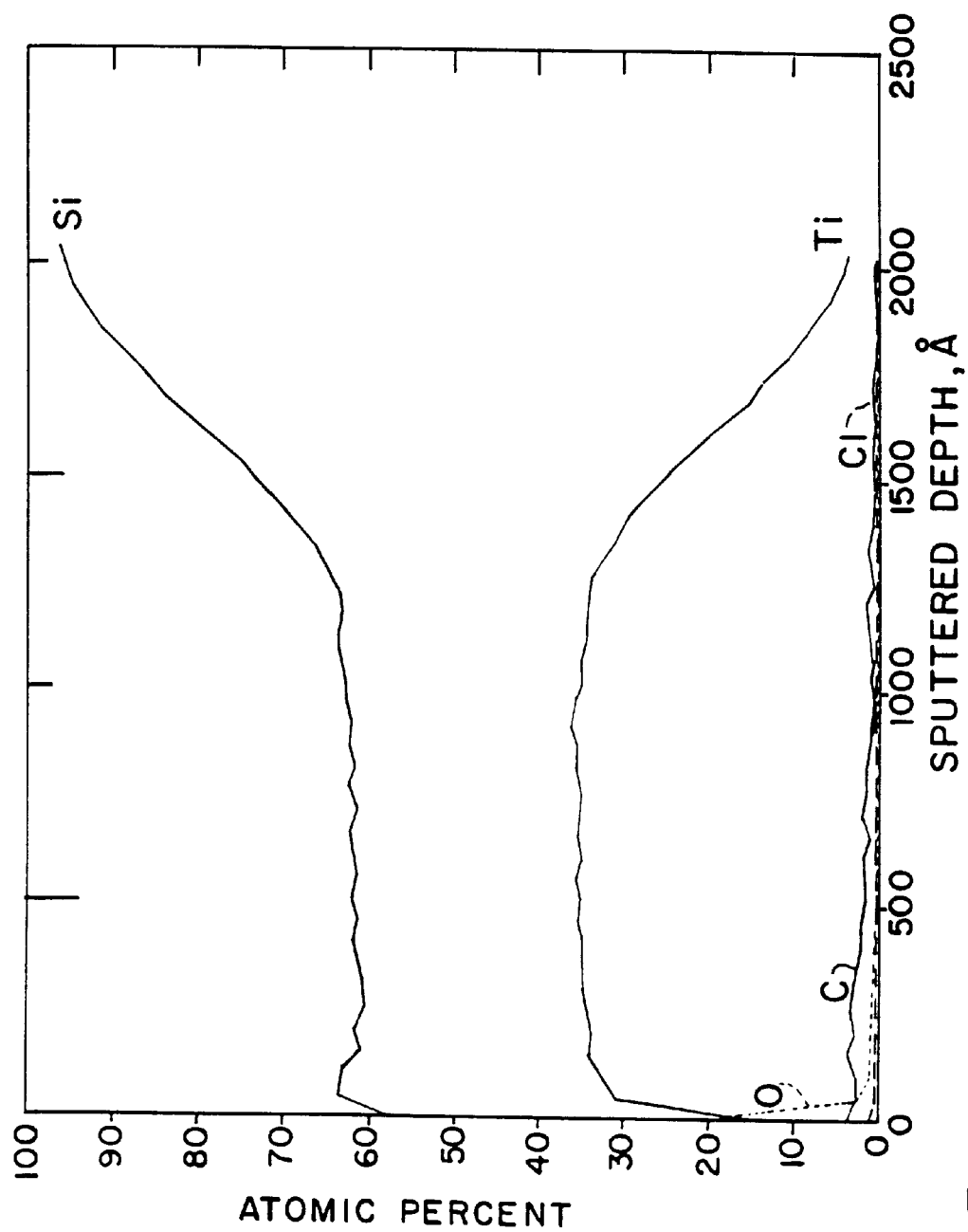
FIG. 5 is the AES depth profile of Ti deposited on Si.

According to the present invention, a salicide or self-aligned silicide, is formed on a semiconductor device (see FIGS. 1A–1D). The semiconductor device is located on a substrate 11 which has deposited thereon a gate electrode 12, a source and drain electrode 13 and 14. On either side of the source electrode and gate electrode are silicon dioxide locos 15 and 16. The source and drain electrodes 13 and 14 are separated from the gate electrode 12 by spacers 17 and 18 and gate oxide 19. The gate electrode 12, source electrode 13 and drain electrode 14 are all formed from silicon.

The method of forming the gate, source, and drain electrodes, as well as locos and spacers, are all well known, form no part of the present invention and can be accomplished in any manner typically employed. Once these are formed, titanium is deposited over the entire structure shown in FIG. 1A by plasma-enhanced chemical vapor deposition.

An apparatus 20 suitable for plasma-enhanced chemical vapor deposition is shown in FIG. 2. The chemical vapor deposition (CVD) apparatus 20 includes an RF showerhead/electrode 22 biased by an RF feedline assembly 24. Plasma and reactant gases are pumped through a cylinder assembly 26 to a substrate 11 on susceptor 30. Apparatus 20 includes a housing having a housing cover 32 and includes an RF supply assembly 34, a heat pipe assembly 36 with cooling jacket 37 and associated fluid supply lines and a gas distributor cover 39 with a sealing assembly 41. A cylinder 38 made of an insulating material such as quartz surrounds the RF feed line assembly 24.

Cylinder 38 is preferably formulated out of a high quality quartz such as Quartz T08-E, available from Hereaus Amersil. Quartz cylinder 38 is supported by a showerhead/electrode 22, made of a conductive metal such as Nickel-200. An annular bore 40 is formed within housing cover 32 to receive an upper end 42 of cylinder 38. O-rings 43, 44 at the interface between stepped bore 40 and cylinder 38 form a seal at the interface. At the lower end 46 of cylinder 38, an annular notch 48 in cylinder 38 receives a peripheral edge 50 of the showerhead/electrode 22. The notch 48 of cylinder 38 rests upon the peripheral edge 50 of showerhead/electrode 22. Showerhead/electrode 22 includes a stem 52 attached to RF line tubing 54, such as by a weld at 55, to form a unitary RF line 56. RF line 56 is frictionally held and supported at its top end by collar 58. The RF line, in turn, supports showerhead/electrode 22 above susceptor 30. Showerhead/electrode 22, in turn, supports the cylinder 38 within the cylinder assembly 26 by abutting against cylinder 38 at notch 48 and holding it in bore 40. The interface between showerhead/electrode peripheral edge 50 and cylinder notch 48 is sealed by a compressed O-ring 59 which is compressed between shelf 48 and a similar corresponding annular notch 60 formed in peripheral edge 50 of the showerhead/electrode 22. A plurality of gas halos or rings 62, 64 introduce reactant gases into cylinder 38.

Generally, the substrate 11 is spaced from about 0.25 to 2 inches from the showerhead/electrode 22. The distance should be such that active ions strike the substrate.

In general, reaction gases are introduced through rings 62 and 64. These pass through cylinder 38 and a plasma is generated as the gases pass through the showerhead/electrode 22. The plasma will strike the substrate 11.

Titanium is deposited onto substrate 11 by plasma-enhanced chemical vapor deposition. The plasma-enhanced chemical vapor deposition reaction is a reaction involving titanium tetrachloride and hydrogen conducted at elevated temperatures. The reactant gas mixture will include titanium tetrachloride, hydrogen and a higher atomic weight, inert gas such as argon. The concentration of titanium tetrachloride is relatively low and is rate determinative. A flow rate of 5 sccm can be employed, although this can be reduced by employing a diluent. Thus, a flow rate of from 0.5 to 10 or more sccm is appropriate.

A substantial stoichiometric excess of hydrogen is employed, preferably from about 500 to 10,000 sccm of hydrogen, with about 1,500 preferred when the titanium tetrachloride flow rate is 5 sccm.

The reactant gases may optionally include a high atomic weight inert gas, preferably argon. Argon can be introduced at a flow rate of 1 sccm to 1000 sccm with about 300 sccm preferred. The purpose of the argon is to assist in breaking up the titanium tetrachloride molecule. These reactant gases are combined in the reactor through rings 62 and 64 and pass through cylinder 38 to showerhead/electrode 22 where a plasma is created. The RF power should be effective to establish a plasma. This can be as low as 10 watts up to several kilowatts with about 250 watts preferred.

The substrate will be located on a susceptor and heated to about 400° C. to about 800° C. with 530° C. preferred. The susceptor itself is rotated simply to provide a more even coating. This can be rotated at from 0 to 1000 rpm with 100 rpm generally acceptable. The pressure within the reaction chamber is maintained from about 0.5 torr to about 20 torr with 5 torr being preferred.

Reaction time can significantly affect the present process. As shown in FIG. 3, the titanium is initially deposited only on the silicon. Therefore, for approximately the first 30 seconds or 35–40 Å of titanium, titanium is deposited only onto the silicon. Titanium silicide thickness is typically 2.5 times the deposited Ti thickness. This corresponds to formation of 100 Å titanium silicide. This is shown in FIG. 1B wherein elements 67, 68 and 69 are formed by titanium reacting with silicon.

As titanium is deposited onto silicon, it immediately reacts with the silicon to form the titanium silicide 67, 68 and 69. Thus, if less than about 100 Å of titanium silicide is required, the reaction can be stopped after 30 seconds or less and no etching is required.

If a thicker layer of titanium silicide is required, the reaction is continued for a total of up to about 400 seconds. This will provide a deposited titanium layer of about 40 to 400 Å. As shown in FIG. 1C, titanium deposited on the silicon portions forms titanium silicide 71, 72, 73 without any further anneal. Titanium deposited on the silicon dioxide layers (i.e., over locos and spacers) forms a substoichiometric titanium/silicon compound 74 having the formula $TiSi_x$ wherein X is less than 2.

FIG. 4 shows a depiction of the layer of titanium silicon reaction product on silicon dioxide. This layer is a titanium-rich deposit that includes some silicon at the oxide interface. However, it is still primarily titanium. This layer 74 must then be removed with a chemical etch.

After the plasma-enhanced chemical vapor deposition is completed, the substrate is removed from the reactor, allowed to cool to room temperature and etched with an acid etch for about 120 seconds. A suitable acid etch is formed from 3 parts hydrogen peroxide (30%) and 1 part sulfuric acid (95–97%). This will remove any titanium on the substrate, along with the $TiSi_x$ layer formed on the silicon dioxide.

With the salicide completed, the interconnect can then be completed by deposition of subsequent insulation layers and/or aluminum metalization, as preferred.

The table shows various parameters used to deposit Ti onto the silicon.

| | $TiCl_4$ | H2 | Ar | Press (Torr) | Back Press (Torr) | Dep. Time (sec) | Rotation (rpm) | Heater Zone Slave % | Suscep Temp Set Point | Wafer Temp | RF Power (watts) |
|---|---|---|---|---|---|---|---|---|---|---|---|
| | | | | | | DEPOSITION CONDITIONS (ACTUAL) | | | | | |
| 1 | | 1500 | 300 | 5 | 2 | 120 | 100 | 0.0 | 610 | 530 | 250 |
| 2 | | 1500 | 300 | 5 | 2 | 120 | 100 | 0.0 | 610 | 530 | 250 |
| 3 | | 1500 | 300 | 5 | 2 | 120 | 100 | 0.0 | 610 | 530 | 250 |

-continued

| | | | | | | | | | | |
|---|---|---|---|---|---|---|---|---|---|---|
| 4 | 1500 | 300 | 5 | 2 | 120 | 100 | 0.0 | 610 | 530 | 250 |
| 5 | 1500 | 300 | 5 | 2 | 120 | 100 | 0.0 | 610 | 530 | 250 |
| 6 | 1500 | 300 | 5 | 2 | 120 | 100 | 0.0 | 610 | 530 | 250 |
| 3 | 1500 | 300 | 5 | 2 | 120 | 100 | 70.0 | 610 | 530 | 250 |
| 3 | 1500 | 300 | 5 | 2 | 120 | 100 | 70.0 | 610 | 530 | 250 |
| 3 | 1500 | 300 | 5 | 2 | 120 | 100 | 90.0 | 610 | 530 | 250 |
| 3 | 1500 | 300 | 5 | 2 | 120 | 100 | 90.0 | 610 | 530 | 250 |
| 3 | 1500 | 300 | 5 | 2 | 120 | 100 | 130.0 | 610 | 530 | 250 |
| 3 | 1500 | 300 | 5 | 2 | 120 | 100 | 130.0 | 610 | 530 | 250 |
| 3 | 1500 | 300 | 5 | 2 | 120 | 100 | 110.0 | 610 | 530 | 250 |
| 3 | 1500 | 300 | 5 | 2 | 120 | 100 | 110.0 | 610 | 530 | 250 |
| 3 | 1500 | 300 | 5 | 2 | 120 | 100 | 110.0 | 610 | 530 | 250 |

RESULTS

| Ti thknss (Å) | Deposition Rate (Å/min) | Rs (Ω/sq.) | Res µΩcm | Sh. Res. Dev. (%) | UNF (±) | COMMENTS |
|---|---|---|---|---|---|---|
| 232 | 115.92 | 97.54 | 226.13 | 5.33 | 13.75 | 30 SEC. DIP 100:1 HF |
| 147 | 73.71 | 62.00 | 91.41 | 9.98 | 28.79 | 30 SEC. DIP 100:1 HF |
| 312 | 156.24 | 53.52 | 167.23 | 4.89 | 8.16 | 30 SEC. DIP 100:1 HF |
| 336 | 168.21 | 44.51 | 149.74 | 5.38 | 10.86 | 30 SEC. DIP 100:1 HF |
| 348 | 173.88 | 41.94 | 145.85 | 8.05 | 13.86 | 30 SEC. DIP 100:1 HF |
| 315 | 157.50 | 61.91 | 195.01 | 6.32 | 13.45 | 30 SEC. DIP 100:1 HF |
| 214 | 107.10 | 101.79 | 218.04 | 11.45 | 24.63 | 30 SEC. DIP 100:1 HF |
| 193 | 96.39 | 108.15 | 208.49 | 13.38 | 22.98 | 30 SEC. DIP 100:1 HF |
| 152 | 76.23 | 104.66 | 159.57 | 9.25 | 16.34 | 30 SEC. DIP 100:1 HF |
| 158 | 78.75 | 104.43 | 164.48 | 8.97 | 17.14 | 30 SEC. DIP 100:1 HF |
| 161 | 80.64 | 88.936 | 143.44 | 6.78 | 14.83 | 30 SEC. DIP 100:1 HF |
| 146 | 73.08 | 88.23 | 128.96 | 9.54 | 24.89 | 30 SEC. DIP 100:1 HF |
| 0 | 0.00 | 89.26 | 0.00 | 6.49 | 13.42 | 30 SEC. DIP 100:1 HF |
| 0 | 0.00 | 92.99 | 0.00 | 5.94 | 11.67 | 30 SEC. DIP 100:1 HF |
| 0 | 0.00 | 97.11 | 0.00 | 7.57 | 14.62 | 30 SEC. DIP 100:1 HF |

FIG. 5 shows the AES depth profile of titanium deposited onto the silicon. This demonstrates the formation of silicide by practicing the present invention.

This method provides the advantage of forming titanium silicide on the silicon electrodes without a high-temperature anneal. This eliminates the silicon diffusion that can occur and could cause shorting of the interconnect. This also eliminates a relatively complex step which, in turn, improves reliability of the end product. Overall, this reduces cost and improves reliability.

This has been a description of the present invention, along with the best mode currently known to the inventors of practicing the invention. However, the invention itself should only be defined by the appended claims wherein we claim:

1. A method of forming titanium silicide over at least one selected region of silicon on a semiconductor substrate adjacent insulators, said method comprising:
   depositing elemental titanium over a surface of said semiconductor substrate including said selected region of silicon by plasma-enhanced chemical vapor deposition of titanium, whereby as titanium is deposited onto said silicon it immediately reacts with said silicon, without further heating thereby forming titanium silicide on said selected region of silicon.

2. The method claimed in claim 1 wherein said insulators are regions of silicon dioxide and wherein titanium is deposited for a period of time effective so that titanium is only deposited on said selected region of silicon without being deposited on said regions of silicon dioxide.

3. The method claimed in claim 2 wherein said time is less than 30 seconds.

4. The method claimed in claim 1 further comprising chemically etching titanium deposited on said substrate.

5. The method claimed in claim 1 wherein said titanium is deposited by establishing a plasma of reactant gases, said reactant gases including titanium tetrachloride and hydrogen, and contacting said substrate with said plasma at a temperature less than 800° C.

6. The method claimed in claim 2 wherein 1 to 40 Å of titanium is deposited.

7. The method claimed in claim 1 whereby titanium deposited onto said selected regions of silicon forms titanium silicide, and wherein titanium deposited onto said regions of silicon dioxide on said substrate forms $TiSi_X$ wherein "X" is less than 2, wherein said substrate is treated with a chemical etchant effective to remove titanium and $TiSi_X$, but not effective to remove titanium silicide.

8. The method claimed in claim 1 wherein a plasma of reactant gases is established at a distance less than or equal to 2 inches from said substrate.

9. The method of forming a self-aligned silicide interconnect on a semiconductor substrate, said semiconductor substrate including a plurality of silicon electrodes separated by silicon dioxide insulators;
   depositing elemental titanium onto said substrate by creating a plasma formed from reactant gases comprising titanium tetrachloride, hydrogen and an inert gas;
   contacting said substrate with said plasma whereby titanium is deposited onto said substrate and titanium deposited onto said silicon electrodes forms titanium silicide without further heating;
   chemically etching said substrate to remove titanium without removing said titanium silicide.

* * * * *

UNITED STATES PATENT AND TRADEMARK OFFICE
CERTIFICATE OF CORRECTION

PATENT NO. : 5,972,790

DATED : October 26, 1999

INVENTOR(S) : Chantal Arena, Robert F. Foster, Joseph T. Hillman, Michael S. Ameen and Jacques Faguet.

It is certified that error appears in the above-identified patent and that said Letters Patent is hereby corrected as shown below:

In column 4, line 22 it reads "As titanium", and it should read -- "As elemental titanium".

Signed and Sealed this

Twenty-seventh Day of March, 2001

Attest:

NICHOLAS P. GODICI

*Attesting Officer*   *Acting Director of the United States Patent and Trademark Office*

UNITED STATES PATENT AND TRADEMARK OFFICE
CERTIFICATE OF CORRECTION

PATENT NO. : 5,972,790
DATED : October 26, 1999
INVENTOR(S) : Arena et al.

It is certified that error appears in the above-identified patent and that said Letters Patent is hereby corrected as shown below:

<u>After [73] Assignee:</u>
Tokyo Electron Limited, Tokyo, Japan insert "and Commissariat a l' Energie Atomique, Paris, France".

Signed and Sealed this

Twenty-eighth Day of August, 2001

Attest:

NICHOLAS P. GODICI
Attesting Officer Acting Director of the United States Patent and Trademark Office